(12) United States Patent
Stief

(10) Patent No.: US 6,586,978 B2
(45) Date of Patent: Jul. 1, 2003

(54) DELAY LOCKED LOOP

(75) Inventor: Reidar Stief, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/177,945

(22) Filed: Jun. 20, 2002

(65) Prior Publication Data

US 2003/0011412 A1 Jan. 16, 2003

(30) Foreign Application Priority Data

Jun. 20, 2001 (DE) .......................... 101 29 783

(51) Int. Cl.[7] ................................ H03L 7/06

(52) U.S. Cl. ...................... 327/158; 327/161

(58) Field of Search ............... 327/158, 153, 327/149, 150, 151, 155, 154, 156, 159, 160, 161, 31–38; 375/373, 375, 376; 331/25

(56) References Cited

U.S. PATENT DOCUMENTS

| 5,552,727 | A | * | 9/1996 | Nakao | ................ 327/159 |
| 5,917,873 | A | * | 6/1999 | Shiomoto et al. | ........... 375/376 |
| 5,994,934 | A | | 11/1999 | Yoshimura et al. | ......... 327/158 |
| 6,157,690 | A | | 12/2000 | Yoneda | ................ 375/376 |
| 6,348,823 | B1 | * | 2/2002 | Pan | ........................ 327/159 |

FOREIGN PATENT DOCUMENTS

JP 58 161 426 A 9/1983

* cited by examiner

Primary Examiner—Timothy P. Callahan
Assistant Examiner—Linh Nguyen
(74) Attorney, Agent, or Firm—Laurence A. Greenberg; Werner H. Stemer; Gregory L. Mayback

(57) ABSTRACT

A delay locked loop has a filter in order to set the delay time of a delay path in a manner dependent on the phase difference of input and output clock signals. The phase difference is ascertained by a phase detector. An additional control circuit determines the number of drive pulses of the filter and additionally controls the number of effective counter stages of a counter that forms the filter. The transient recovery time of the delay locked loop is thereby reduced.

9 Claims, 3 Drawing Sheets

DELAY LOCKED LOOP

BACKGROUND OF THE INVENTION

Field of the Invention

The invention relates to a delay locked loop that synchronizes an output clock with an input clock by delaying the input clock via a controllable delay path. The controllable delay time is set by a feedback loop containing a phase detector and a filter. The invention additionally relates to a method for operating such a delay locked loop.

A delay locked loop (DLL) is used in integrated circuits in order to synchronize an on-chip clock signal with a clock signal fed in externally. In today's electronic systems, for example in motherboards of personal computers, the various integrated circuits forming the system are operated clock-synchronously. Ever faster clock rates require that the specific timing specifications of the exchanged signals be complied with as exactly as possible. The available timing margins become smaller, so that the clock signals must be synchronized with one another as accurately as possible. A DLL has the task of carrying out this synchronization for a respective integrated circuit.

In particular, synchronously operating dynamic semiconductor memories, so-called SDRAMS (Synchronous Dynamic Random Access Memories) have a DLL which synchronizes an internal clock signal with a clock signal fed in from off-chip. The internally generated clock signal controls, for example, the time validation for the data signals that will be output. This compensates for the internal delay times of the fed-in clock signal on the semiconductor chip, so that the output data are present with a specific phase angle relative to the external operating clock. In the DLL, a phase detector determines the deviation between the external clock and the internal clock and accordingly readjusts the internal clock that is provided at the output of the DLL in a manner dependent on the external clock fed to the input of the DLL.

The filter, which sets the variable delay time of the delay path, ensures that the adjustment of the delay time by connecting in or disconnecting delay elements is not effective for every phase change that can occur in principle in every clock cycle. Previous filter concepts have the disadvantage that the delay time is adjusted only after the iteration of a fixed number of clock cycles. This number of clock cycles is independent of the phase difference between the input clock and the output clock. This means that the delay locked loop has different reaction times depending on the measure of the phase difference. The transient recovery time particularly in the case of a comparatively large phase difference that will be corrected is therefore relatively long.

U.S. Pat. No. 5,994,934 shows a delay locked loop having an external feedback loop and also an internal feedback loop that attaches to the loop filter and eliminates lock problems in the event of an excessive delay time ("Lock Deviation Phenomenon"). The delay locked loop otherwise has a delay circuit with a controllable delay time, a phase detector and also the loop filter.

U.S. Pat. No. 6,157,690 shows a digital phase locked loop in which the delay path can be controlled by a control circuit in order to effect an immediate phase shift, in the event of a comparatively large phase error, and a less rapidly executed phase correction in the event of a comparatively small phase error.

Published Japanese Patent Application JP 58-161426 shows the embodiment of a loop filter with flip-flops, shift registers and logic combination elements for a digital phase locked loop.

SUMMARY OF THE INVENTION

It is accordingly an object of the invention to provide a delay locked loop and a method for operating the delay locked loop which overcomes the above-mentioned disadvantages of the prior art apparatus and methods of this general type.

In particular, it is an object of the invention to provide a delay locked loop whose transient recovery duration is always as short as possible.

With the foregoing and other objects in view there is provided, in accordance with the invention, a delay locked loop, including: an input for obtaining a signal to be delayed; an output for providing a delayed signal; and a delay circuit connected between the input and the output. The delay circuit has an output and a controllable delay time. The delay locked loop also includes a phase detector having an input coupled to the input for obtaining the signal to be delayed. The phase detector has another input coupled to the output of the delay circuit. The phase detector has an output. The delay locked loop also includes a filter having: a first input being controlled by the output of the phase detector; an output coupled to the delay circuit to control the delay time of the delay circuit; a multistage counter having counter stages connected between the first input and the output, and a second input. The delay locked loop also includes a control logic circuit for feeding back the output of the filter to the second input of the filter in order to control a number of the counter stages that are effective between the first input of the filter and the output of the filter.

In accordance with an added feature of the invention, the first input of the filter includes at least two inputs; the output of the filter includes at least two outputs; the at least two inputs of the filter and the at least two outputs of the filter are connected between the phase detector and the delay circuit; one of the at least two outputs of the filter is provided for increasing the delay time of the delay circuit; another one of the at least two outputs of the filter is provided for reducing the delay time of the delay circuit; the counter stages of the multistage counter of the filter include a first counter connected between a respective one of the at least two inputs of the filter and a respective one of the at least two outputs of the filter; and the counter stages of the multistage counter of the filter include a second counter connected between a respective one of the at least two inputs of the filter and a respective one of the at least two outputs of the filter.

In accordance with an additional feature of the invention, the control logic circuit includes an output; the first counter and the second counter each include at least a first stage having an output, a second stage having an input, and a changeover switch connected between the first stage and the second stage; the changeover switch is controlled by the output of the control logic circuit; the changeover switch has a first switch position in which the output of the first stage is coupled with the input of the second stage; and the changeover switch has a second switch position in which the output of the first stage is coupled with one of the outputs of the filter.

In accordance with another feature of the invention, an integrator for accumulating a number of pulses at the output of the filter; a comparison logic device for comparing the number of the pulses being accumulated by the integrator with a first reference value; and the comparison logic device, in a manner dependent on the comparing, controlling the number of the counter stages that are effective.

In accordance with a further feature of the invention, the first reference value is formed in a manner dependent on the number of the counter stages that are effective.

In accordance with a further added feature of the invention, the comparison logic device includes a counter for counting a number of pulses of the signal to be delayed; the comparison logic device includes a first comparator for comparing the number of the pulses that have been counted with a further reference value; the comparison logic device includes a second comparator for, in a manner prompted by the first comparator, comparing the number of the pulses at the output of the filter with the first reference value; and the number of the pulses at the output of the filter is generated by the integrator.

In accordance with a further additional feature of the invention, the number of the counter stages that are effective is reduced if a number of pulses at the output of the filter exceeds a first reference value within a predetermined number of pulses of the signal to be delayed; and the number of the counter stages that are effective is increased if the number of the pulses at the output of the filter falls below the first reference value within the predetermined number of pulses of the signal to be delayed.

With the foregoing and other objects in view there is also provided, in accordance with the invention, a method for operating the delay locked loop. The method includes steps of: providing the delay locked loop; reducing the number of the counter stages that are effective if a number of pulses at the output of the filter exceeds a first reference value within a predetermined number of pulses of the signal to be delayed; and increasing the number of the counter stages that are effective if the number of the pulses at the output of the filter falls below the first reference value within the predetermined number of pulses of the signal to be delayed.

In other words, the method for operating such a delay locked loop includes the fact that the number of effective counter stages is reduced if the number of pulses at the output of the filter exceeds a first reference value within a predetermined number of pulses of the clock signal that can be fed in at the input of the delay locked loop, and that the number of effective counter stages of the counter of the filter is increased if the number of pulses at the output of the filter falls below the first reference value within the predetermined number of pulses of the clock signal that can be fed to the input of the delay locked loop.

In the case of the delay locked loop and the method, the filter has a counter that is controlled by a further, internal feedback loop which feeds the output of the counter back to a further input of the counter. The additional internal feedback loop controls the number of effective counter stages of the multistage counter. In the event of a large phase deviation between the input signal and the output signal of the delay locked loop, few counter stages will be activated, so that the transient recovery time is shortened. The delay time of the controllable delay path is adjusted depending on these pulses. The number of pulses is therefore a measure of the phase deviation between the output clock signal and the input clock signal of the delay locked loop. If the number of the output pulses of the delay locked loop exceeds a predetermined first reference value, this is interpreted to the effect that the phase difference is relatively large. The number of effective counter stages is therefore automatically reduced in order to accelerate the adjustment of the delay time of the delay path and thus the transient recovery process. Conversely, if the number of output pulses of the filter falls below this reference value, this means that the phase deviation is small. The number of effective counter stages is thereupon increased in order thereby to increase the stability of the control.

By virtue of the additional internal control loop, counter stages are automatically connected in or disconnected, so that ultimately, a predetermined reaction time of the delay locked loop is always ensured. The sensitivity of the delay locked loop is thus set adaptively to the measure of the phase difference between the internal clock signal to be generated and the clock signal that is fed in externally. The phasing of the delay locked loop to the clock fed in externally is thereby reduced.

As is known, the current consumption of a digital circuit realized in CMOS circuitry is determined by the switching frequency of the gates. Since electronic systems are in many cases embodied in a portable and battery-operated manner, endeavors are made to keep the current consumption as low as possible. The current consumption of a delay locked loop arranged on an SDRAM (Synchronous Dynamic Random Access Memory), for example, is not inconsiderable. Fast phasing means fewer changes in the time delay of the delay path and fewer switching operations. The current consumption of the SDRAM is therefore reduced by the circuit according to the invention.

A development of the invention provides for the filter to have a first output in order to reduce the delay time of the delay circuit. Each of the outputs is assigned a counter which, on the input side, is driven in turn by a separate output of the phase detector. The cascaded stages of the counter are connected in and disconnected in each case in parallel and in the same way.

A control logic device generates corresponding control signals in order to effect the connecting-in and disconnection of the individual counter stages. For this purpose, a changeover switch is arranged between two counter stages. This changeover switch has a first switch position that connects the output of an upstream-connected counter stage to the input of a downstream-connected counter stage. A second switch position of the changeover switch taps off the output of an upstream-connected counter stage and connects it directly to the corresponding output of the filter. The downstream counter stages are deactivated by this bypass.

The internal feedback loop attaches to the abovementioned output terminals of the filter and counts or accumulates the number of output pulses at the filter. For this purpose, a counting logic device which is referred to as an integrator is used and may be embodied as a binary or shift counter and can be reset in various ways. By way of example, the integrator can count only counting pulses of the same sense by being incremented only when successive pulses are output for increasing the delay time or reducing the delay time of the delay circuit. When the type of pulse changes, the integrator is reset and integrates from the beginning. On the other hand, the integrator can be embodied as an up and down counter, in which case it counts in one direction in the case of pulses of one type and in the other direction in the case of pulses of the other type.

The number of pulses counted by the integrator is compared with a first reference value. If the number of pulses is higher than the reference value then this means that there is a large phase shift to be corrected. On account of a pulse of the phase detector, an output pulse of the counter for adjusting the delay circuit is therefore to be generated with the shortest possible reaction time. Consequently, in this case, higher-value counter stages of the counter are disconnected or circumvented by the bypass. If the number of output pulses of the counter which is accumulated by the integrator lies below the reference value, this means that the input signals have only a small phase shift with respect to one another and the adjustment of the delay circuit should therefore be slowed down. Therefore, higher-value counter stages are supplementarily connected in an effective fashion.

The described comparison of the number of pulses counted by the integrator logic with the first reference value is expediently effected after a specific time window has elapsed. For this purpose, the number of the clock edges of the externally supplied clock signal is counted or accumulated and compared with a further reference value. The further reference value specifies the size of the time window. If the number of counted clock pulses reaches the further reference value, the comparison described above is performed.

For further adaptation of the control, the abovementioned first reference value, which enters into the comparison of the number of the output pulses of the filter that are counted by the integrator, is set adaptively in a manner dependent on the number of effective counter stages. By way of example, the first reference value is formed by specifying a desired value that is additionally divided by the number of effective counter stages in order to form the first reference value.

The method of operation described above and the circuit features described above are arranged in the additionally formed internal control loop, which feeds the output of the filter back to the further inputs of the filter. As described, this controls, in particular, the number of effective counter stages of the counter of the filter. The method of operation described is realized in the form of wired logic; that is to say with counters, registers and logic gates. Finally, the delay locked loop of the invention overall achieves a transient recovery duration that is as short as possible, an optimized current consumption and a reaction time that is as constant as possible. This is because the additional control loop adaptively takes account of the instantaneous operating conditions of the delay locked loop.

Other features which are considered as characteristic for the invention are set forth in the appended claims.

Although the invention is illustrated and described herein as embodied in a delay locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
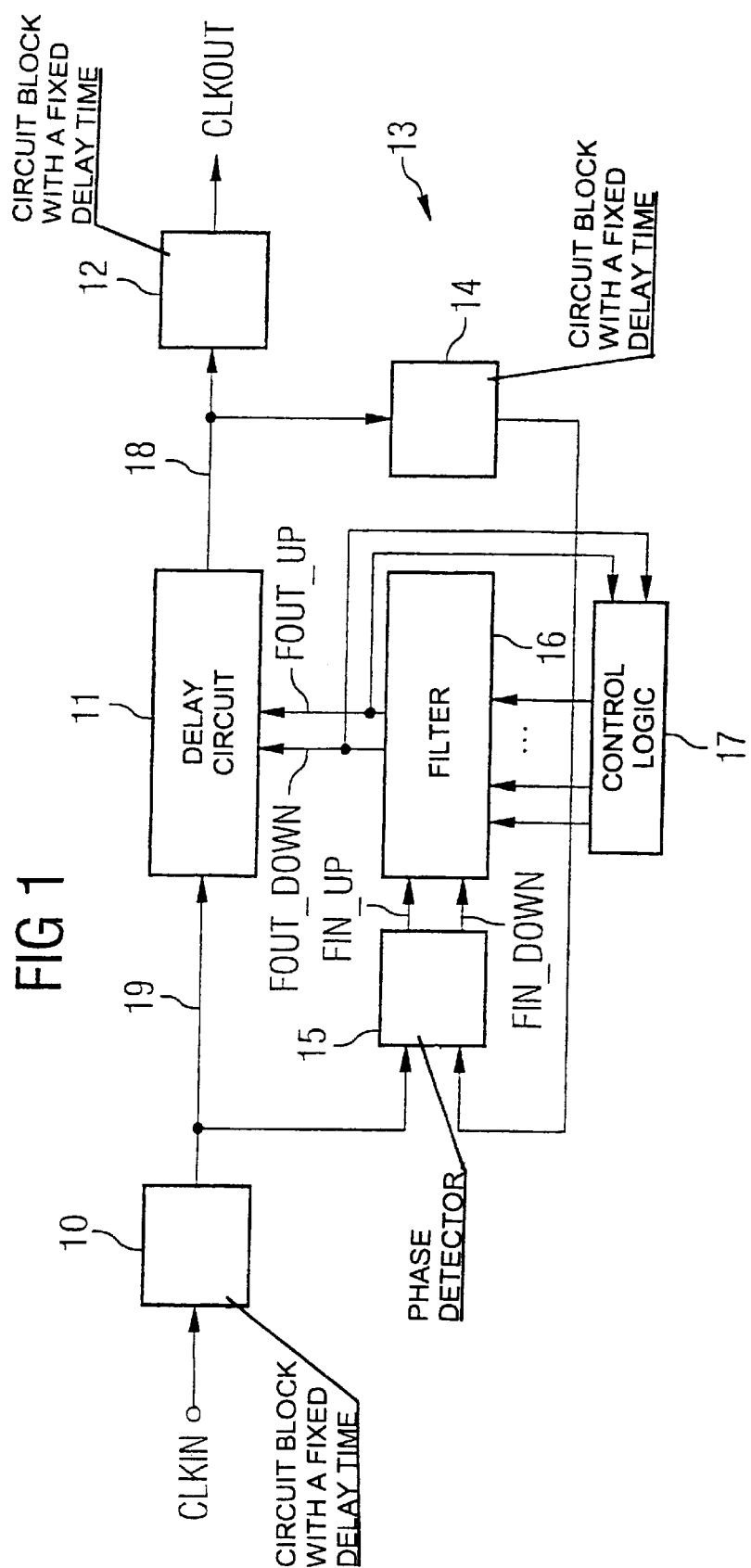
FIG. 1 shows a block diagram of a delay locked loop with an additional internal control loop.

Referring now to the figures of the drawing in detail and first, particularly, to FIG. 1 thereof, there is shown a delay locked loop (DLL) having an input terminal, to which a clock signal CLKIN can be fed. The clock signal CLKIN is applied, for example, externally to the integrated circuit. The delay locked loop (DLL) has an output providing a clock signal CLKOUT that is delayed to such an extent that the output clock signal CLKOUT has a fixed phase relationship, synchronously, with respect to the input clock signal CLKIN. A delay circuit 11 is connected between the input and the output. The delay circuit 11 has a delay time that can be set in a manner dependent on a control loop 13. In addition, a circuit block 10 with a fixed delay time TI is connected directly to the input, and a circuit block 12 with a fixed delay time TO is connected directly to the output. The blocks 10, 12 can simulate, for example, delay times of the signal input or signal output circuits, so-called receivers or off-chip drivers. The control loop attaches within the circuit blocks 10, 12, that is to say directly on the input and output with regard to the delay circuit 11 with a controllable delay.

The feedback loop 13 includes a circuit block 14 with a fixed delay time dT, via which the output of the delay circuit 11 is fed back to an input of a phase detector or phase discriminator 15. The other input of the phase detector 15 is connected to the input of the connection 19 of the delay circuit 11. The phase detector 15 ascertains the phase difference between the two signals fed to its inputs and generates output signals, depending on the direction or the sign of the phase shift ascertained, in order to increase or decrease the delay time of the delay circuit 11. The output signals of the phase detector are fed to a filter 16 in order to effect low-pass filtering. Finally, the output signals of the filter 16 control the delay time of the delay circuit 11. The output of the phase detector 15 generates a first output signal FIN_UP having pulses that are fed to the filter 16. The filter 16 uses the pulses of the signal FIN_UP to generate correspondingly filtered pulses FOUT_UP in order to increase the delay time of the delay circuit 11. This means that delay elements that additionally delay the input signal CLKIN are activated in the delay circuit 11. The phase detector 15 generates a further output signal FIN_DOWN, which is fed to the filter 16. The filter outputs correspondingly filtered pulses FOUT_DOWN to the delay circuit 11 in order to reduce the delay time thereof by disconnecting delay elements. The signals FIN_UP and FIN_DOWN are generated in a manner dependent on the ascertained sign of the phase difference of the signals that are fed to the phase detector 15. In this respect, the invention corresponds to conventional delay locked loops.

The invention now provides a further internal control loop. This internal control loop is connected to the output of the filter 16 and feeds the output signals FOUT_UP and FOUT_DOWN back, via control logic 17, to further input terminals of the filter 16. The filter 16 includes two counters with inputs that can be driven by the signals FIN_UP and FIN_DOWN and that can delay the pulses thereof. The control logic 17 actively connects or disconnects the respective higher-value stages of these counters. The detailed construction of the filter 16 and of the control logic 17 is described below.

Figure 2:
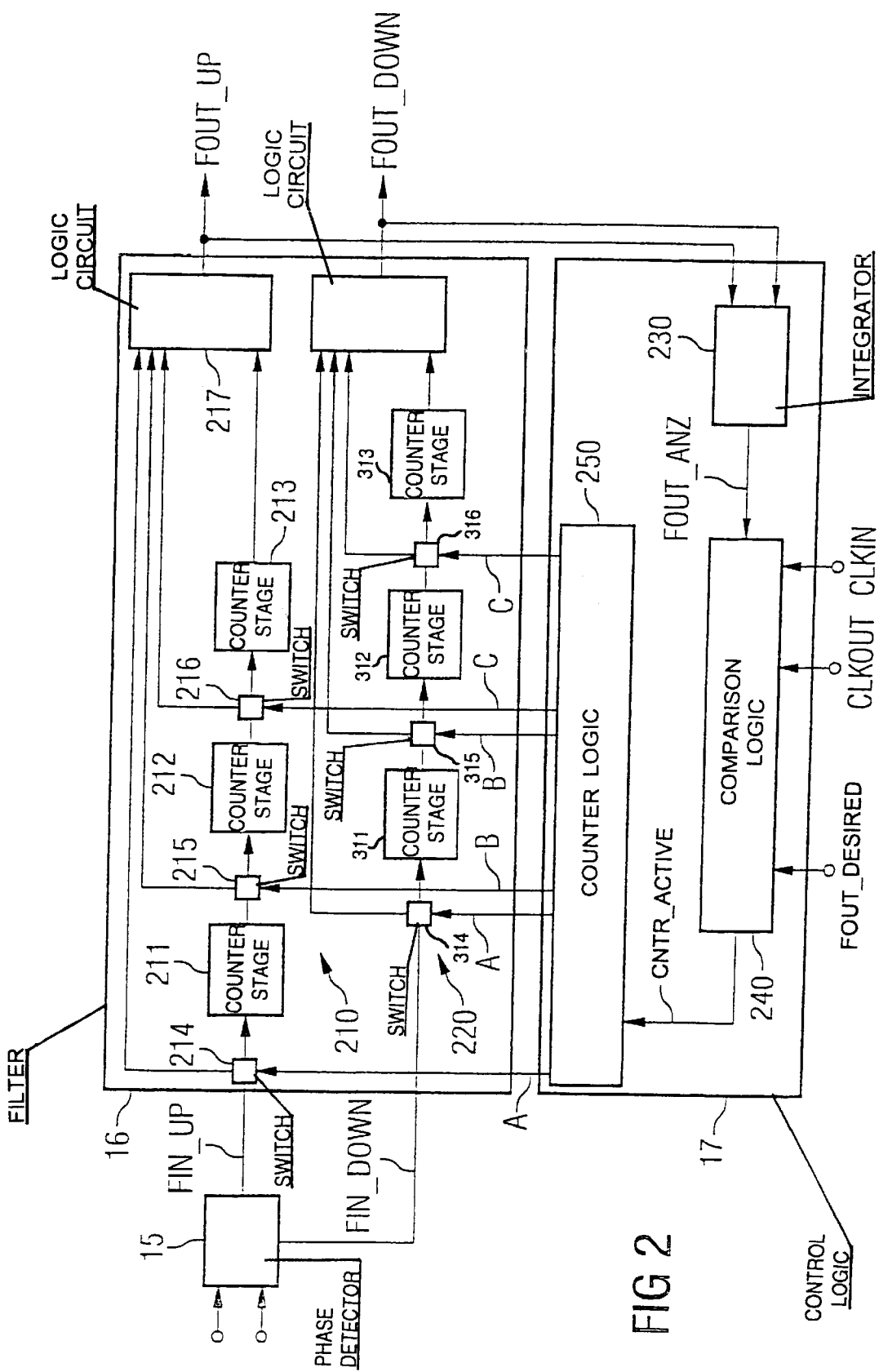
FIG. 2 shows a circuit diagram of a filter and of the additional internal control loop.

FIG. 2 shows the filter 16, which includes a first counter 210 and a second counter 220. The input of the first counter 210 can be driven by the step-up pulse FIN_UP. The input of the second counter 220 can be driven by the step-down pulse FIN_DOWN. Both counters are constructed correspondingly and are driven in parallel by the control logic 17. The counter 210 will be described in greater detail. The counter 210 has serially cascaded counter stages 211, 212, 213. By way of example, each of the counter stages includes a two-bit counter; it can assume four states. Four pulses have to be fed to the input of the respective counter stage in order for a pulse to be output. The counter stages 211, 212, and 213 can in each case have an identical or a different number of counting stages depending on the requirements of the filter. The counter stages 311, 312, and 313 of the second counter 220 are constructed similarly to those in the first counter 210. can in each case have an The coupling between the counting stages and the coupling of the input to the input signal FIN_UP is effected via respective changeover switches 214, 215, 216. All of the changeover switches are normally configured in the same way.

Figure 4:
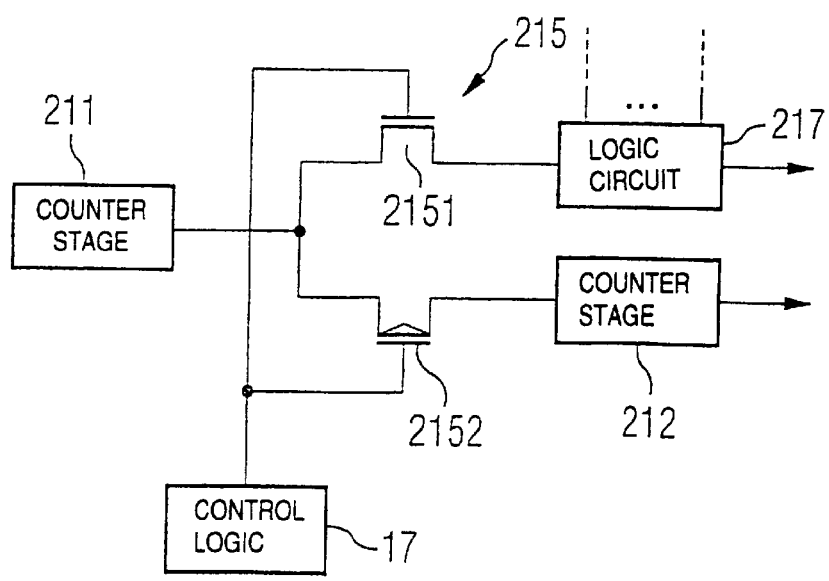
FIG. 4 shows an exemplary embodiment of a changeover switch configured between the counter stages of the filter.

FIG. 4 shows, for example, the changeover switch 215 in its environment. The changeover switch has two complementary field-effect transistors 2151, 2152, which are driven by the control logic 17. On the one hand, the controlled paths of the transistors are coupled to one another and are connected to the output of the counter stage 211. On the other hand, the controlled path of the P-channel transistor 2152 is connected to the input of the counter stage 212 and the controlled path of the N-channel transistor 2151 is connected to a logic circuit 217. Depending on the signals output by the control logic 17, either one or the other of the complementary transistors is turned on, so that either the next counter stage, e.g. the stage 212, is actively connected, or the next counter stage is disconnected. In addition, a bypass is formed that circumvents this and higher-value counter stages that are connected downstream. The bypass is coupled directly into a logic circuit 217. The logic circuit 217 receives all the other paths of the comparable changeover switches 214 and 216 and interconnects these signal paths to the output carrying the signal FOUT_UP of the filter 16. The filter logic 217 is an OR gate, for example. If the control logic 17 carries a high level, the N-channel transistor 2151 is turned on and deactivates the counter stages 212, 213 connected downstream, so that the output signal of the lower-value filter stage 211 is coupled directly into the filter logic 217. The other counter, which filters the step-down signal FIN_DOWN, is constructed correspondingly. In the example shown, the counter stages 211, 212, 213 are two-bit counters. A more sensitive control by the control logic 17 results if one-bit counters are used instead.

Referring again to FIG. 2, the input of the control logic 17 includes an integrator 230. The output of the integrator 230 is coupled to a comparison logic device 240. The comparison logic device 240 finally controls a counter logic 250, which at the output thereof, generates the control signals for driving the changeover switches 214, 215, 216 of the first counter 210 and the changeover switches 314, 315, 316 of the second counter 220. The integrator 230 is driven on the input side by the control signals FOUT_UP, FOUT_DOWN. The integrator 230 accumulates or counts the pulses of the signals FOUT_UP and FOUT_DOWN. The number of counted pulses is forwarded as the signal FOUT_ANZ to the comparison logic device 240. In one embodiment, the integrator 230 can be designed in such a way that only events in the same sense are ever counted and the counting is subsequently reset if a pulse in a different sense occurs. Thus, by way of example, a sequence of directly successive pulses of the signal FOUT_UP is counted and forwarded as the signal FOUT_ANZ to the comparison logic device 240. If a pulse FOUT_DOWN then occurs, the integrator 230 is reset and counts the pulses of the signal FOUT_DOWN until a pulse of the signal FOUT_UP again occurs. In an alternative configuration of the integrator 230, pulses of the signals FOUT_UP and FOUT_DOWN are jointly accumulated in a single counter.

The comparison logic device 240 compares the value of the signal FOUT_ANZ fed to it with a reference value FOUT_DESIRED. If the number of signal changes FOUT_ANZ is greater than or equal to the signal reference value FOUT_DESIRED, this is interpreted as a large phase difference between the on-chip clock CLKOUT and the clock CLKIN fed in externally. In this case, the DLL is intended to react more quickly and the number of effective counter stages of the counters 210, 220 is reduced by corresponding driving of the changeover switches 214, 215, 216. If the number of signal changes FOUT_ANZ is less than the reference value FOUT_DESIRED, this is interpreted as a small phase difference between the clock signals mentioned, and the number of effective counter stages of the counters 210, 220 is increased. In this case, the DLL reacts more slowly to the respective pulses FIN_UP or FIN_DOWN. The comparison is carried out in each case after the number of pulses of the external clock signal CLKIN defined by CLKREF has occurred. A time window is defined by the specification of the clock reference value CLKREF. The comparison logic device 240 generates a two-bit output signal CNTR_ACTIVE, depending on which the counter logic 250 generates the output signals A, B and C in order to drive the changeover switches e.g. 214, 215, 216. The logical function of the counter logic 215 is represented by the table below:

| Signal CNTR_ACTIVE | Signals A, B, C |
|---|---|
| 00 | All signals A, B, C at low level. All the counter stages, e.g. 211, 212, 213, are active. |
| 01 | Signals A, B at low level, signal C at high level. The highest-value counter stage, e.g. 213, is deactivated. |
| 10 | Signal A at low level, signals B, C at high level. The two highest-value counter stages, e.g. 212, 213, are deactivated. |
| 11 | All signals A, B, C at high level. All the counter stages are deactivated. |

An improvement and adaptation of the control property is achieved by the comparison between the reference value FOUT_DESIRED and the number of counted pulses FOUT_ANZ being adapted to the number of counter stages active in the filter 16. Thus, in accordance with this development, the count FOUT_ANZ is compared with the quotient of FOUT_DESIRED and CNTR_ACTIVE. This avoids the situation that the delay locked loop assumes the extreme settings too quickly, i.e. either that all the counter stages are activated, or that all the counter stages are deactivated.

Figure 3:
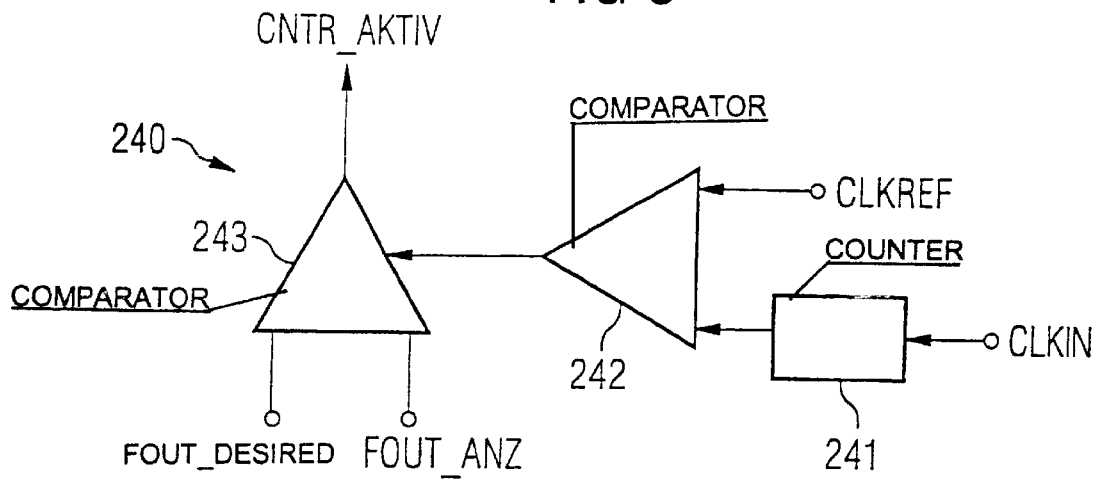
FIG. 3 shows a circuit diagram of a comparison logic device configured within the additional internal control loop.

The comparison logic device 240 is preferably embodied in the manner illustrated in FIG. 3. The comparison logic device 240 has a counter 241, to which the external clock signal CLKIN is fed and which counts the counting pulses, e.g. the rising edges of the clock signal CLKIN. The counter value is compared with a reference value CLKREF in a comparator 242. The output signal of the comparator 242 triggers the comparison between the signals FOUT_ANZ and FOUT_DESIRED which is carried out in a further comparator 243. The comparator 243 generates the two-bit output signal CNTR_ACTIVE. For the configuration variant described above, the quotient of FOUT_DESIRED/CNTR_ACTIVE is alternatively fed to the comparator 243.

A concrete operating example based on exemplary numerical values for the various settings and counting signals is described below using the exemplary embodiment illustrated in the figures. Each of the counters 211, 212, 213 is a two-bit counter. If all three counters are active, a six-bit counter is present, with the result that at least 64 pulses of the signal FIN_UP must be present in order to generate a pulse of the signal FIN_OUT. The clock reference value CLKREF should be a multiple of 64; a value of 128 is fixed in this example. This means that, after 128 clock cycles in the comparator 243, the number of signal changes FOUT_ANZ is compared with the corresponding reference value FOUT_DESIRED. At the beginning of the operating example, two counters are active, i.e. CNTR_ACTIVE=2. The signal reference value is fixed at FOUT_DESIRED=2. If the maximum possible phase difference between the input signals is present at the phase detector 15, then given the specification CLKREF=128, within a number of 128 clock cycles, eight signal changes are possible for the signals FOUT_UP, FOUT_DOWN. It must be taken into account that two counters are active, with the result that at least 16 clock cycles are required in order to generate a pulse of the signals FOUT_UP or FOUT_DOWN. FOUT_ANZ=8 and FOUT_DESIRED=2 are present at the inputs of the comparator 243. Since FOUT_ANZ is greater than FOUT_DESIRED, the comparator 243 sets the signal CNTR_ACTIVE=10, so that the number of active counters is decreased by one. Consequently, a maximum of 32 signal changes can occur for the signals FOUT_P, FOUT_DOWN without the number of effective counter stages being changed. The DLL thus reacts more quickly.

If it is assumed that a minimal phase difference between the input signals is present at the phase detector 15, assuming CLKREF=128, only one signal change has occurred within a number of 128 clock cycles of the external clock signal CLKIN.

Consequently, FOUT_ANZ=1 holds true. FOUT_ANZ=1 and FOUT_DESIRED=2 are present at the comparator 243, so that the comparator 243 sets the signal CNTR_ACTIVE=11 (since FOUT_ANZ<FOUT_DESIRED holds true), in order to increase the number of active counters by one. It is now possible for a maximum of two pulses of the signals FOUT_UP, FOUT_DOWN to occur within 128 pulses of the external clock signal CLKIN.

The operating example is modified below by the quotient of FOUT_DESIRED and CNTR_ACTIVE being fed to the comparator 243 as the one comparison value. It is assumed that two counters are active at the beginning, CNTR_ACTIVE=2. Moreover, the reference value for the number of counted output pulses is FOUT_DESIRED=6.

Presupposing that a maximum phase difference between the signals present at the phase detector 15 is present, eight pulses of the signals FOUT_UP, FOUT_DOWN are possible within 128 clock cycles of the clock signal CLKIN. The comparator 243 compares the signals FOUT_ANZ=8 and the quotient FOUT_DESIRED=6/CNTR_ACTIVE=2. The comparator 243 sets CNTR_ACTIVE=01, so that the number of active counters is decreased by one. Thirty-two (32) signal changes of FOUT_UP, FOUT_DOWN can occur within 128 clock cycles of the external clock signal CLKIN without the counter setting changing. The DLL thus reacts more quickly.

Presupposing that the minimum possible phase difference between the input signals is present at the phase detector 15, only one signal change occurs within 128 clock cycles of the external clock signal CLKIN, i.e. FOUT_ANZ=1. At the comparator 243, FOUT_ANZ=1 is compared with the quotient FOUT_DESIRED=6/CNTR_ACTIVE=2. The comparator 243 makes a decision and sets the value CNTR_ACTIVE=11, so that the number of active counters is increased by one. It is now possible for a maximum of two signal changes to occur within 128 clock cycles of the external clock signal CLKIN, with the counter setting of the filter 16 being maintained. The DLL thus reacts more slowly.

I claim:

1. A delay locked loop, comprising:

an input for obtaining a signal to be delayed;

an output for providing a delayed signal;

a delay circuit connected between said input and said output, said delay circuit having an output and a controllable delay time;

a phase detector having an input coupled to said input for obtaining the signal to be delayed, said phase detector having another input coupled to said output of said delay circuit, said phase detector having an output;

a filter having:
   a first input being controlled by said output of said phase detector,
   an output coupled to said delay circuit to control the delay time of said delay circuit,
   a multistage counter having counter stages connected between said first input and said output, and
   a second input; and a control logic circuit for feeding back said output of said filter to said second input of said filter in order to control a number of said counter stages that are effective between said first input of said filter and said output of said filter.

2. The delay locked loop according to claim 1, wherein:

said first input of said filter includes at least two inputs;

said output of said filter includes at least two outputs;

said at least two inputs of said filter and said at least two outputs of said filter are connected between said phase detector and said delay circuit;

one of said at least two outputs of said filter is provided for increasing the delay time of said delay circuit;

another one of said at least two outputs of said filter is provided for reducing the delay time of said delay circuit;

said counter stages of said multistage counter of said filter include a first counter connected between a respective one of said at least two inputs of said filter and a respective one of said at least two outputs of said filter; and said counter stages of said multistage counter of said filter include a second counter connected between a respective one of said at least two inputs of said filter and a respective one of said at least two outputs of said filter.

3. The delay locked loop according to claim 2, wherein:

said control logic circuit includes an output;

said first counter and said second counter each include at least a first stage having an output, a second stage having an input, and a changeover switch connected between said first stage and said second stage;

said changeover switch is controlled by said output of said control logic circuit;

said changeover switch has a first switch position in which said output of said first stage is coupled with said input of said second stage; and said changeover switch has a second switch position in which said output of said first stage is coupled with one of said outputs of said filter.

4. The delay locked loop according to claim 1, comprising:

an integrator for accumulating a number of pulses at said output of said filter;

a comparison logic device for comparing the number of the pulses being accumulated by said integrator with a first reference value; and said comparison logic device, in a manner dependent on the comparing, controlling the number of said counter stages that are effective.

5. The delay locked loop according to claim 4, wherein:

the first reference value is formed in a manner dependent on the number of said counter stages that are effective.

6. The delay locked loop according to claim 4, wherein:

said comparison logic device includes a counter for counting a number of pulses of the signal to be delayed;

said comparison logic device includes a first comparator for comparing the number of the pulses that have been counted with a further reference value;

said comparison logic device includes a second comparator for, in a manner prompted by said first comparator, comparing the number of the pulses at said output of said filter with the first reference value; and the number of the pulses at said output of said filter is generated by said integrator.

7. The delay locked loop according to claim 6, wherein:

the first reference value is formed in a manner dependent on the number of said counter stages that are effective.

8. The delay locked loop according to claim 1, wherein:

the number of said counter stages that are effective is reduced if a number of pulses at said output of said filter exceeds a first reference value within a predetermined number of pulses of said signal to be delayed; and the number of said counter stages that are effective is increased if the number of the pulses at said output of said filter falls below the first reference value within the predetermined number of pulses of said signal to be delayed.

9. A method for operating the delay locked loop according to claim 1, which comprises:

providing the delay locked loop according to claim 1;

reducing the number of said counter stages that are effective if a number of pulses at said output of said filter exceeds a first reference value within a predetermined number of pulses of said signal to be delayed; and increasing the number of said counter stages that are effective if the number of the pulses at said output of said filter falls below the first reference value within the predetermined number of pulses of said signal to be delayed.

* * * * *